(12) United States Patent
Li et al.

(10) Patent No.: US 11,081,427 B2
(45) Date of Patent: Aug. 3, 2021

(54) SEMICONDUCTOR DEVICE WITH THROUGH SILICON VIA STRUCTURE

(71) Applicant: UNITED MICROELECTRONICS CORP., Hsinchu (TW)

(72) Inventors: Zhao-Bing Li, Singapore (SG); Ju-Bao Zhang, Singapore (SG); Chi Ren, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/998,137

(22) Filed: Aug. 20, 2020

(65) Prior Publication Data
US 2020/0381340 A1 Dec. 3, 2020

Related U.S. Application Data

(60) Continuation of application No. 16/701,201, filed on Dec. 3, 2019, now Pat. No. 10,784,185, which is a
(Continued)

(30) Foreign Application Priority Data
Jul. 11, 2017 (TW) ................................. 106123251

(51) Int. Cl.
*H01L 23/48* (2006.01)
*H01L 25/065* (2006.01)
(Continued)

(52) U.S. Cl.
CPC ...... *H01L 23/481* (2013.01); *H01L 21/76898* (2013.01); *H01L 22/34* (2013.01);
(Continued)

(58) Field of Classification Search
CPC ..... H01L 23/34; H01L 23/481; H01L 23/522; H01L 23/5226; H01L 24/10; H01L 24/24; H01L 24/92; H01L 25/0657; H01L 25/50; H01L 24/80; H01L 24/82; H01L 2224/08145; H01L 2224/24145;
(Continued)

(56) References Cited

U.S. PATENT DOCUMENTS 8,546,953 B2 10/2013 Horng et al.
8,742,590 B2 6/2014 Beyne
(Continued)

*Primary Examiner* — Matthew E Warren
(74) *Attorney, Agent, or Firm* — WPAT, PC

(57) ABSTRACT

A semiconductor device includes at least one wafer and at least one TSV (through silicon via) structure. The at least one wafer each includes a substrate, an isolation structure, and a conductive pad. The isolation structure is formed in the substrate and extends from a first side of the substrate toward a second side opposite to the first side of the substrate. The conductive pad is formed at a dielectric layer disposed on the first side of the substrate, wherein the conductive pad is electrically connected to an active area in the substrate. The at least one TSV structure penetrates the at least one wafer. The conductive pad contacts a sidewall of the at least one TSV structure, and electrically connects the at least one TSV structure and the active area in the substrate. The isolation structure separates from and surrounds the at least one TSV structure.

15 Claims, 6 Drawing Sheets

Related U.S. Application Data division of application No. 15/678,541, filed on Aug. 16, 2017, now Pat. No. 10,546,801.

(51) Int. Cl.
*H01L 23/00* (2006.01)
*H01L 23/522* (2006.01)
*H01L 25/00* (2006.01)
*H01L 21/768* (2006.01)
*H01L 21/66* (2006.01)

(52) U.S. Cl.
CPC ........ *H01L 23/522* (2013.01); *H01L 23/5226* (2013.01); *H01L 24/10* (2013.01); *H01L 24/24* (2013.01); *H01L 24/92* (2013.01); *H01L 25/0657* (2013.01); *H01L 25/50* (2013.01); *H01L 24/80* (2013.01); *H01L 24/82* (2013.01); *H01L 2224/08145* (2013.01); *H01L 2224/24145* (2013.01); *H01L 2224/80896* (2013.01); *H01L 2224/821* (2013.01); *H01L 2224/82031* (2013.01); *H01L 2224/9202* (2013.01); *H01L 2224/9212* (2013.01); *H01L 2225/06541* (2013.01)

(58) Field of Classification Search
CPC . H01L 2224/80896; H01L 2224/82031; H01L 2224/821; H01L 2224/9202; H01L 2224/9212; H01L 2224/06541; H01L 21/76898
USPC .................................................. 257/621, 774
See application file for complete search history.

(56) References Cited

U.S. PATENT DOCUMENTS

| | | | |
|---|---|---|---|
| 2010/0144094 A1* | 6/2010 | Chen | ............... H01L 25/0657 438/109 |
| 2012/0168935 A1* | 7/2012 | Huang | ............... H01L 21/76224 257/737 |
| 2012/0319291 A1* | 12/2012 | Chiou | ............... H01L 23/481 257/774 |
| 2013/0277852 A1 | 10/2013 | Chen | |
| 2014/0054742 A1 | 2/2014 | Katti | |
| 2015/0115463 A1* | 4/2015 | Pelley | ............... H01L 23/42 257/774 |
| 2017/0194291 A1 | 7/2017 | Yu et al. | |
| 2017/0207158 A1* | 7/2017 | Kang | ............... H01L 24/09 |

\* cited by examiner

SEMICONDUCTOR DEVICE WITH THROUGH SILICON VIA STRUCTURE

This application is a continuation application of U.S. application Ser. No. 16/701,201, filed on Dec. 3, 2019, which is a divisional application of U.S. application Ser. No. 15/678,541, filed on Aug. 16, 2017, and claims the benefit of Taiwan application Serial No. 106123251, filed Jul. 11, 2017, the subject matter of which is incorporated herein by reference.

BACKGROUND

Technical Field

The disclosure relates in general to a semiconductor device, and more particularly to a semiconductor device with a Through Silicon Via (TSV) structure.

Description of the Related Art

In recent years, 2.5D (dimensional) and 3D packages are in great demand due to the increased levels of integration they provide. A so called through silicon via (TSV) structure is provided to realize the electrical interconnections in the 2.5D and 3D package. During manufacturing the 2.5D and 3D package, a pad and an under bump metal (UBM) are commonly used to electrically connect each of TSV structures in different wafers. However, if the amount of the UBM is increased, the process cost will also be increased, and the chip performance may be degraded.

SUMMARY

The disclosure is directed to a semiconductor device. The semiconductor device has a Through Silicon Via (TSV) structure, and a sidewall of the TSV structure is connected to a conductive pad. No under bump metal (UBM) is formed on upper and lower surfaces of the TSV structure. The semiconductor device has an isolation structure. The isolation structure is only disposed in the substrate and surrounds the TSV structure. There is no isolation structure in the dielectric layer. Therefore, the provided semiconductor device of the present application can achieve a good electrical connection between the TSV structure and the conductive pad, and a good electrical isolation between the TSV structure and the substrate can also be established by the isolation structure. Accordingly, the cost of the process can be decreased and the chip performance can also be increased.

According to one aspect of the present disclosure, a semiconductor device is provided. The semiconductor device comprises at least one wafer and at least one TSV (through silicon via) structure. The at least one wafer each comprises a substrate, an isolation structure, and a conductive pad. The isolation structure is formed in the substrate and extends from a first side of the substrate toward a second side of the substrate. The second side is opposite to the first side. The conductive pad is formed at a dielectric layer disposed on the first side of the substrate, wherein the conductive pad is electrically connected to an active area in the substrate. The at least one TSV structure has a circular cross-section and penetrates the at least one wafer. The conductive pad contacts a sidewall of the at least one TSV structure, and electrically connects the at least one TSV structure and the active area in the substrate. The isolation structure separates from and surrounds the at least one TSV structure.

According to one aspect of the present disclosure, a method for manufacturing a semiconductor device is provided. The method comprises forming at least one wafer and forming at least one TSV (through silicon via) structure penetrating the at least one wafer. The method for forming the at least one wafer each comprises providing a substrate; forming an isolation structure in the substrate and extended from a first side of the substrate toward a second side of the substrate, wherein the second side is opposite to the first side, and a conductive pad; and forming the conductive pad at a dielectric layer disposed on the first side of the substrate, wherein the conductive pad is electrically connected to an active area in the substrate. The conductive pad contacts a sidewall of the at least one TSV structure, and electrically connects the at least one TSV structure and the active area in the substrate. The isolation structure separates from and surrounds the at least one TSV structure.

The above and other aspects of the invention will become better understood with regard to the following detailed description of the preferred but non-limiting embodiment(s). The following description is made with reference to the accompanying drawings.

Figure 1:
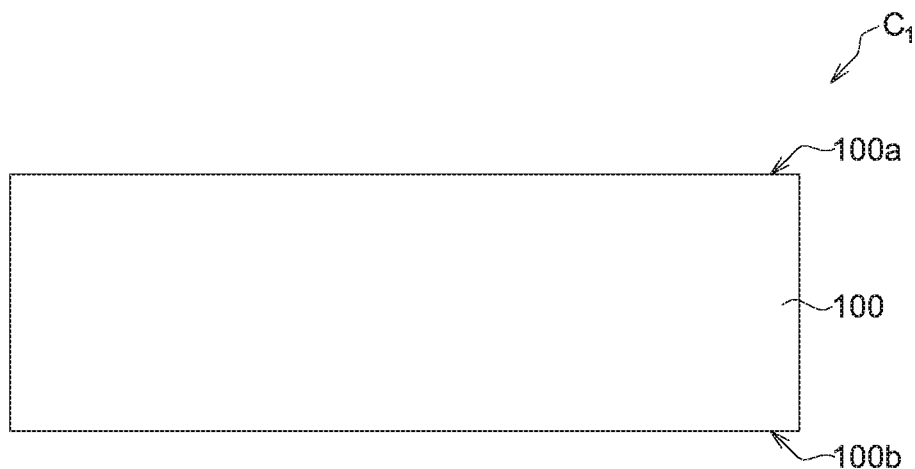
FIG. 1-FIG. 7 illustrate a semiconductor device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The disclosure provides a semiconductor device and a method for manufacturing the same. The semiconductor device and the method for manufacturing the same provide the semiconductor device having a Through Silicon Via (TSV) structure. A sidewall of the TSV structure is connected to a conductive pad to achieve an electrical interconnection between wafers. No under bump metal (UBM) is needed to be formed on upper and lower surfaces of the TSV structure. In this way, the steps in the process can be simplified, and the cost of the process can be reduced. Further, the semiconductor device has an isolation structure. The isolation structure is only disposed in the substrate and surrounds the TSV structure to prevent the leakage between the TSV structure and the substrate. There is no isolation structure in the dielectric layer, and no oxide linear is formed on the sidewall of the TSV structure. Therefore, in the provided semiconductor device of the present application, the sidewall of the TSV structure can directly contact the conductive pad, and a good electrical connection between the TSV structure and the conductive pad can be achieved.

Further, a good electrical isolation between the TSV structure and the substrate can also be established by the isolation structure. Accordingly, the cost of the process can be decreased and the performance of the chip can also be increased.

Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second" in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1-FIG. 7 illustrate a semiconductor device according to one embodiment of the disclosure.

Referring to FIG. 1, a substrate 100 is provided. The substrate 100 has a first side 100a and a second side 100b which is opposite to the first side 100a. For example, the first side 100a and the second side 100b can be a top surface and a bottom surface of the substrate, respectively. The substrate 100 can be a silicon substrate.

Figure 2:
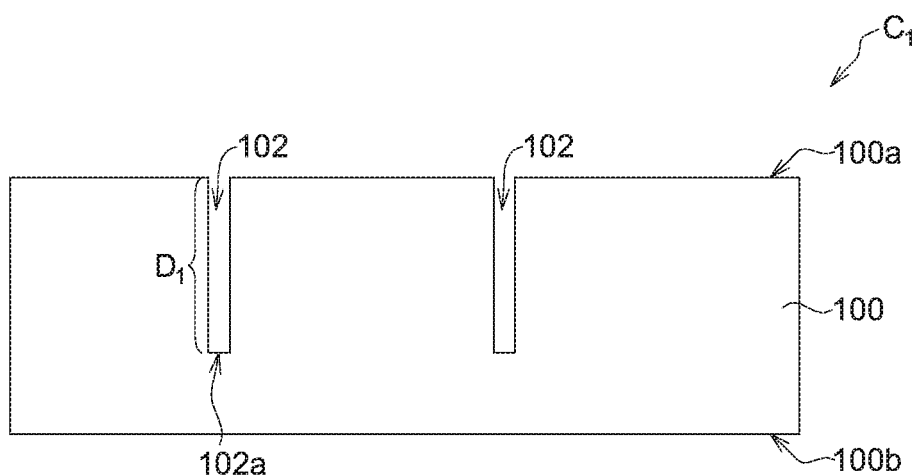
Figure 5:
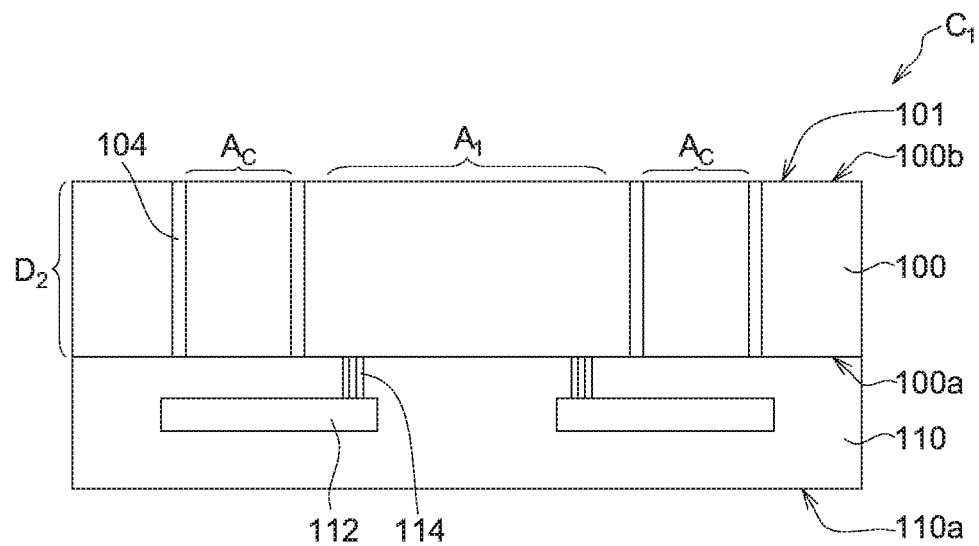

Referring to FIG. 2, a trench 102 is formed in the substrate 100. The trench 102 is formed by, for example, an etching method. The trench 102 extends from the first side 100a of the substrate 100 toward the second side 100b of the substrate 100, but not penetrates through the substrate 100. The trench 102 has a depth D1 extending from a bottom 102a toward the first side 100a. The depth D1 of the trench 102 is larger than a thickness D2 of the substrate 100 after the substrate 100 is thinned down (as shown in FIG. 5). The depth D1 of the trench 102 is, for example, larger than 12 μm. The trench 102 has a width of, for example, 6 μm. A shape of the trench 102 can be a circle, a rectangular, or any other shape which can form a closed loop.

Figure 3:
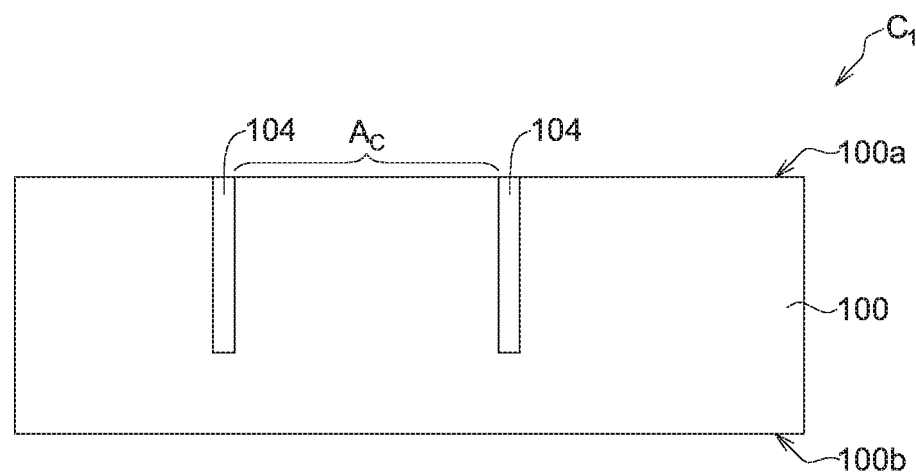
Figure 7:
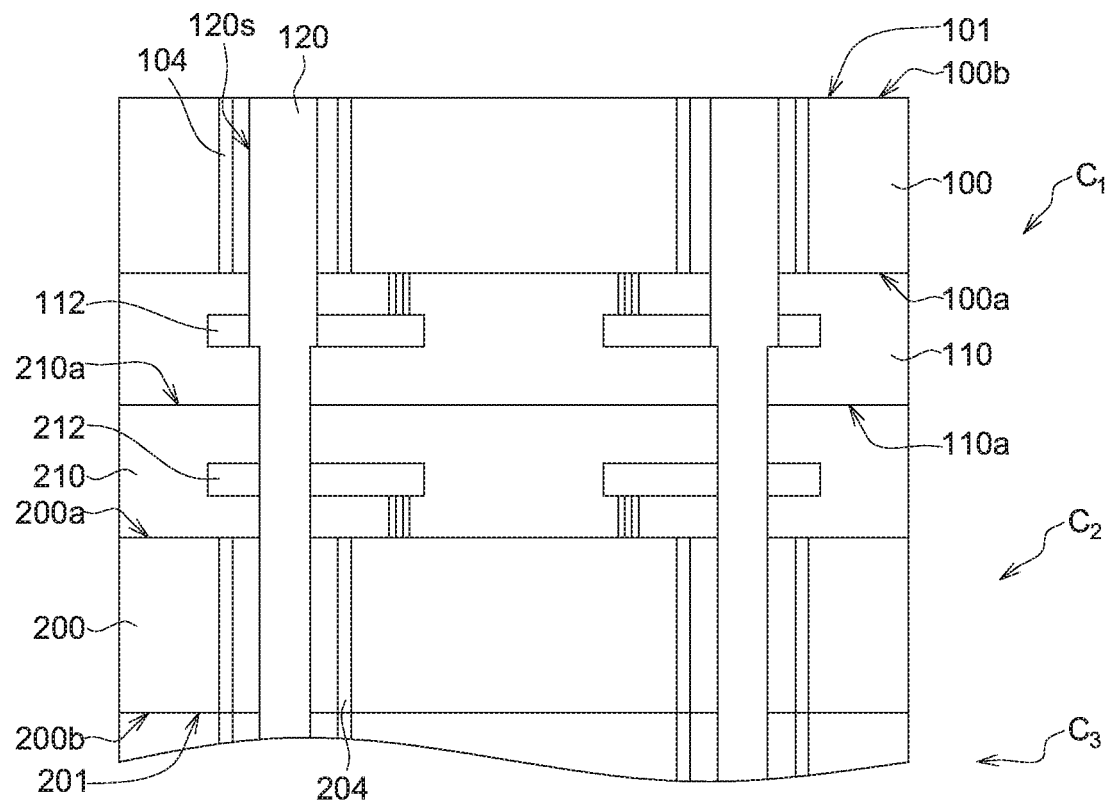

Referring to FIG. 3, a dielectric material can be filled into the trench 102 by, for example, Atomic Layer Deposition (ALD) or Chemical Vapor Deposition (CVD) . . . etc. Next, a Chemical Mechanical Polishing (CMP) step to the first side 100a of the substrate 100 can be performed to form an isolation structure 104 in the trench 102. The isolation structure 104 is, for example, an isolation ring formed in the substrate 100 extending from the first side 100a of the substrate 100 toward the second side 100b of the substrate 100, and defines a closed area Ac to the substrate 100 which is used as a space for forming the TSV structure 120 in the following steps (as shown in FIG. 7). The isolation structure 104 can be formed of a dielectric material, such as an oxide or tetraethoxysilane (TEOS). A shape of the isolation structure 104 can be a circle (as shown in a top view of FIG. 8), a rectangular (as shown in a top view of FIG. 9), or any other shape which can form a closed loop.

Figure 4:
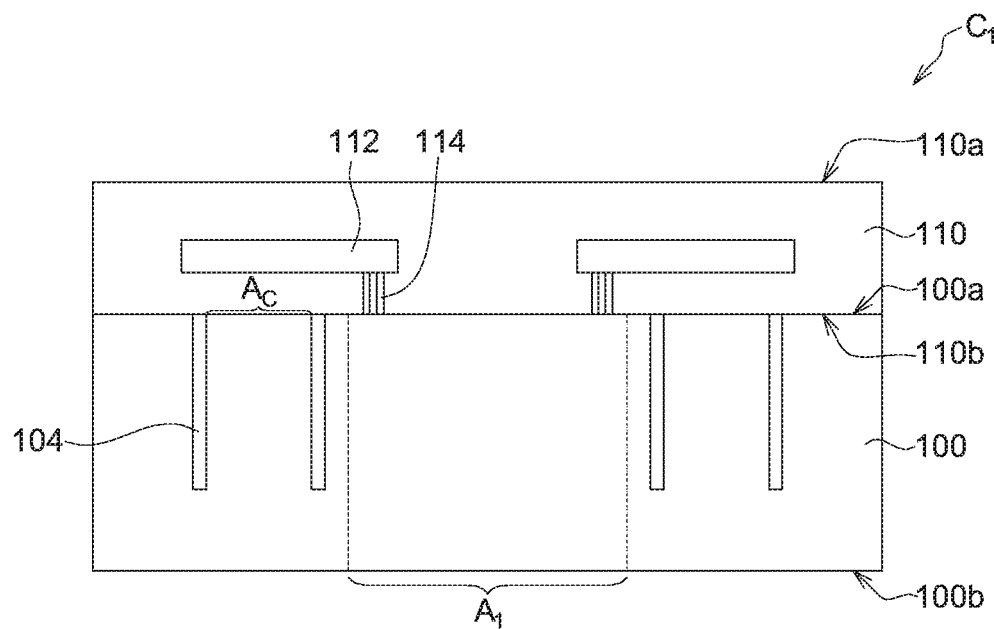

Referring to FIG. 4, a conductive pad 112 is formed at a dielectric layer 110 disposed on the first side 100a of the substrate 100. An active circuit and a conductive line 114 for electrically connecting the active circuit and the conductive pad 112 are formed in the substrate 100. The conductive pad 112 can be formed of aluminum (Al). An area corresponding to the active circuit in the substrate 100 is called as an active area A1. The conductive pad 112 is electrically connected to the active area A1 in the substrate 100, and can be an electrical input/output port of the first wafer C1. The conductive pad 112 corresponds to a closed area Ac formed by the isolation structure 104 in the substrate 100. That is, the conductive pad 112 corresponds to a position where the TSV structure to be formed in the following steps (as shown in FIG. 7), such that the TSV structure 120 can connect to the conductive pad 112 to achieve the electrical connection between each of the wafers. In the present embodiment, the conductive pad 112 is embedded in the dielectric layer 100, and is not exposed from the dielectric layer 100. The dimension of the conductive pad 112 is, for example, 20 μm×20 μm or 25 μm×25 μm. However, the dimension of the conductive pad 112 is not limited thereto. It will be suitable if the dimension of the conductive pad 112 is large enough to contact the TSV structure 120. The dielectric layer 110 has a first surface 110a and a connecting surface 110b contacting the first side 100a of the substrate 100, and the first surface 110a is opposite to the connecting surface 110b, i.e. opposite to the first side 100a of the substrate 100. The dielectric layer 110 can be an inter-metal dielectric (IMD) layer.

Referring to FIG. 5, turn the structure of FIG. 4 upside-down. A thinning process (or a lapping process) is performed from the second side 100b of the substrate 100 to remove a portion of the substrate 100 and expose the isolation structure 104, such that a first wafer C1 is formed. After the thinning process, the thickness D2 of the substrate 100 is smaller than the depth D1. The thickness D2 of the substrate is, for example, 12 μm. The first wafer C1 has a first surface 110a on the dielectric layer 110, and has a second surface 101 on the substrate 100. The first surface 110a is opposite to the first side 100a of the substrate 100. The second surface 101 corresponds to the second side 100b of the substrate 100.

Figure 6:
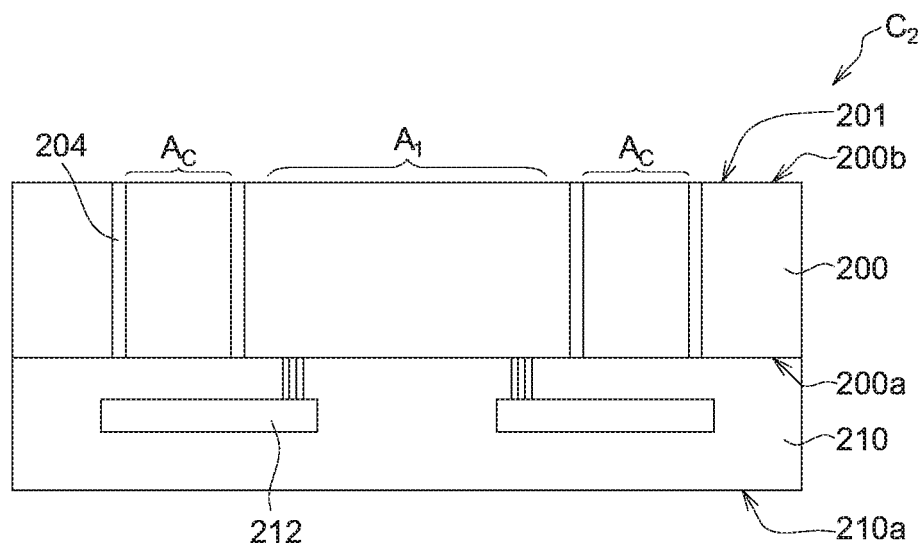

Referring to FIG. 6, a second wafer C2 is formed according to the method for manufacturing the first wafer C1 as described above referring to FIG. 1 to FIG. 5. The second wafer C2 has a first surface 210a on the dielectric layer 201, and has a second surface 201 on the substrate 200. The first surface 210a is opposite to the first side 200a of the substrate 200, and the second surface 201 corresponds to the second side 200b of the substrate 200. In the second wafer C2, the elements similar to that in the first wafer C1 are designated with the similar reference numerals. The redundancy is not repeated here. The present disclosure only exemplarily shows the first wafer C1 and the second wafer C2. However, the present disclosure can also include a third wafer C3, a fourth wafer C4 . . . a $n_{th}$ wafer Cn and so on, wherein n is an integer larger than 1.

Referring to FIG. 7, the first wafer C1, the second wafer C2, the third wafer C3, the fourth wafer C4 . . . and the $n_{th}$ wafer Cn are stacked together to form a semiconductor device 10. In the present embodiment, the first surface 110a of the first wafer C1 is connected to the first surface 210a of the second wafer C2. The second surface 201 of the second wafer C2 is connected to a second surface of the third wafer C3 (not shown). A first surface of the third wafer C3 is connected to a first surface of the fourth wafer C4 (not shown). In the present embodiment, any two of the isolation structures, such as isolation structure 104 and isolation structure 204, are aligned with each other. The closed areas Ac formed by any two of the isolation structures, such as isolation structures 104 and 204, are aligned with each other. Any two of the conductive pads, such as conductive pads 112 and 212, are also aligned with each other.

After forming a stack of n wafers, a TSV structure 120 penetrating through the stack of n wafers is formed corresponding to the determined closed areas Ac formed by the isolation structures, such as isolation structures 104 and 204, and the conductive pads, such as conductive pads 112 and 212. For example, a portion of the substrate 100, the dielectric layer 110, and the conductive pad 112 in the first wafer C1, and a portion of the substrate 200, the dielectric layer 210, and the conductive pad 212 in the second wafer C2 can be removed to form an opening by an etching method, and a conductive material can be filled into the opening to form the TSV structure 120. In the present embodiment, the TSV structure 120 is formed of metal, such as copper (Cu). In one embodiment, the TSV structure 120 can include no insulating material. In this way, the sidewall 120s of the TSV structure 120 directly contact a portion of the substrates, such as substrates 100 and 200, the dielectric layers, such as dielectric layers 110 and 210, and the conductive pads, such as conductive pads 112 and 212. Since the sidewall 120s of the TSV structure 120 has no insulating layer, such as an oxide layer, the sidewall 120s of the TSV structure 120 can directly contact the conductive pads, such as conductive pads 112 and 212, and a good electrical connection can be achieved.

FIG. 7 only exemplarily shows that the TSV structure 120 penetrates through the first wafer C1 and the second wafer C2. However, the present disclosure is not limited thereto. If the semiconductor device 10 further includes the third wafer C3, the fourth wafer C4 . . . the $n_{th}$ wafer Cn, the TSV structure 120 can further penetrate through the wafers described above to achieve the purpose of electrical connection. The conductive pad, such as conductive pads 112 and 212, of each of the wafers can contact the sidewall 120s of the TSV structure 120, and is electrically connected to the active area, such as active areas A1 and A2, in the substrate, such as substrates 100 and 200. The isolation structure, such as isolation structures 104 and 204, of each of the wafers is separated from the TSV structure 120, and surrounds the TSV structure 120. In the present embodiment, the diameter of the TSV structure 120 is 15 μm. Since the etching process is performed from top to bottom, the diameter of the TSV structure 120 can be gradually decreased from top to bottom. The number of the TSV structures, such as TSV structures 120 and 220, can be plural. The number of the isolation structures, such as isolation structures 104 and 204, can also be plural, and one isolation structure 104 surrounds one TSV structure 120. The TSV structure 120 and the TSV structure 220 can be surrounded by different isolation structures 104.

In the present disclosure, the forming of the TSV structure, such as TSV structures 120 and 220, and the forming of the isolation structure, such as isolation structures 104 and 204, are based on multiple wafers, but not a single wafer. The TSV structure, such as TSV structures 120 and 220, is formed as an integral structure after forming a stack of n wafers, but not formed as different TSV structures in n wafers and then being stacked together. Therefore, there is no need to form the conductive pad and under bump metal on both of the top and bottom surfaces of the TSV structure to electrically connect the n wafers. Accordingly, the amount of the under bump metal can be reduced, the cost of the process can be decreased and the chip performance can be increased by forming the TSV structure, such as TSV structure 120 and 220, of the present application. Additionally, the possible leakage between the TSV structure and the substrate may be prevented by forming the isolation structure, such as isolation structures 104 and 204, in the substrate, which surrounds the TSV structure, such as TSV structure 120 and 220, of the present application. Since the isolation structure, such as isolation structures 104 and 204, is not formed in the dielectric layer, such as dielectric layers 110 and 210, the electrical connection between the TSV structure, such as TSV structure 120 and 220, and the conductive pad, such as conductive pads 112 and 212, can not be affected by the isolation structure.

Figure 8:
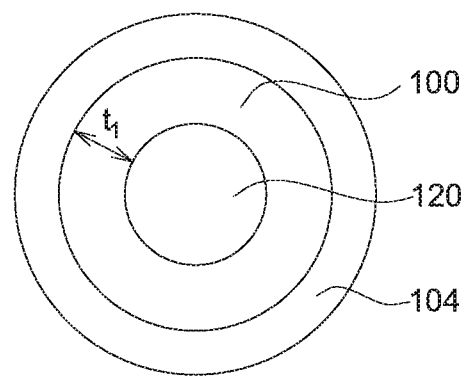
FIG. 8 is a top view of a semiconductor device according to one embodiment of the disclosure.

FIG. 8 is a top view of a semiconductor device according to one embodiment of the disclosure. Referring to FIG. 8, it particularly illustrates a top view of the TSV structure 120 in FIG. 7. In the present embodiment, the isolation structure 104 has a shape of circle, and is separated from the TSV structure 120 by a portion of the substrate 100 with a same distance t1. The distance t1 is, for example, 6 μm.

Figure 9:
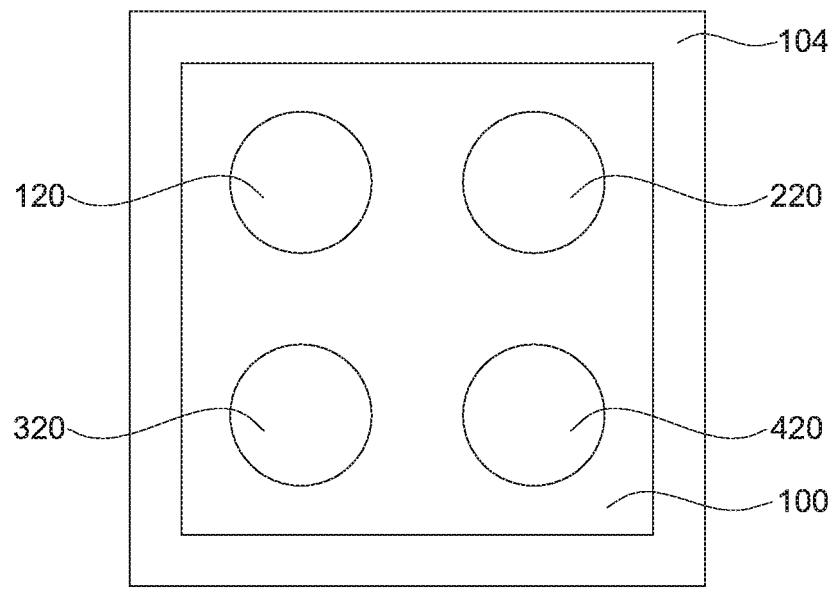
FIG. 9 is a top view of a semiconductor device according to another embodiment of the disclosure.

FIG. 9 is a top view of a semiconductor device according to another embodiment of the disclosure. Referring to FIG. 9, the isolation structure 104 has a shape of rectangular. One isolation structure 104 surrounds four TSV structures 120, 220, 320 and 420.

In other embodiment, the isolation structure can be any kind of shape which can form a closed loop, such as oval, triangle and rhombus, according to the design of the circuit, and can surround any amount of TSV structures.

Figure 10:
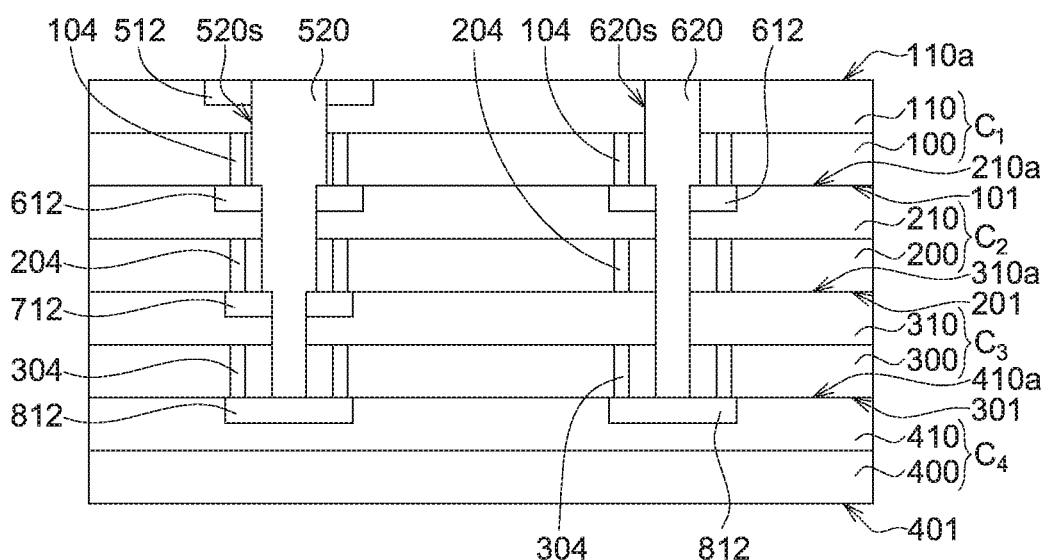
FIG. 10 is a cross-section view of a semiconductor device according to a further embodiment of the disclosure.

FIG. 10 is a cross-section view of a semiconductor device according to a further embodiment of the disclosure.

Referring to FIG. 10, the first wafer C1, the second wafer C2, the third wafer C3 and the fourth wafer C4 are stacked together in the same direction, and a semiconductor device 20 is formed. The first surface 110a of the first wafer C1 is exposed to the top of the semiconductor structure 20. The second surface 401 of the fourth wafer C4 is exposed to the bottom of the semiconductor structure 20. The second surface 101 of the first wafer C1 is connected to the first surface 210a of the second wafer C2. The second surface 201 of the second wafer C2 is connected to the first surface 310a of the third wafer C3. The second surface 301 of the third wafer C3 is connected to the first surface 410a of the fourth wafer C4. The conductive pads 512, 612, 712 and 812 are not embedded in the dielectric layers 110, 210, 310 and 410, but are exposed from the dielectric layers 110, 210, 310 and 410. The isolation structures 104, 204 and 304 respectively surround the TSV structures 520 and 620 in the substrates 100, 200 and 300. Conductive pads 512, 612 and 712 contact sidewalls 520s and 620s of the TSV structures 520 and 620. The conductive pads 812 contact the bottom of the TSV structures 520 and 620. Since the TSV structure 520 is determined to transmit the electrical signal from the first wafer C1 to the fourth wafer C4, conductive pads 512, 612, 712 and 812 are formed in each of the wafers. The conductive pads 512, 612, 712 and 812 are used as the signal input/output port of the first to fourth wafers C1-C4. Since the TSV structure 620 is determined to transmit the electrical signal between the second wafer C2 and the fourth wafer C4, only the conductive pads 612 and 812 are formed in the second wafer C2 and the fourth wafer C4.

According to the embodiment described above, the present disclosure provides a semiconductor device and method for manufacturing the same. The semiconductor device has a TSV structure, and the sidewall of the TSV structure contacts the conductive pad in the dielectric layer. In comparison with the comparative example which needs to form the conductive pads and under bump metal on top and bottom surfaces of the TSV structures in each of the wafers, no conductive pad and under bump metal are needed to be formed on top and bottom surfaces of the TSV structure of the present disclosure, such that the amount of the under bump metal can be greatly reduced, the step of process can be simplified, the cost of the process can be decreased and the chip performance can be increased. Furthermore, the sidewall of the TSV structure of the present application directly contacts the conductive pad in the dielectric layer, and no oxide linear is formed on the sidewall of the TSV structure. Therefore, the electrical connection between the TSV structure and the conductive pad is really excellent in the present application. In addition, the semiconductor structure has an isolation structure. The isolation structure only surrounds the TSV structure in the substrate to prevent the possible leakage between the TSV structure and the substrate. Thus, the semiconductor device provided in the present application not only achieve a good electrical connection between the TSV structure and the conductive pad, but also can establish a good electrical isolation between the TSV structure and the substrate. The cost and the time for the process can be decreased and the performance of the chip can also be increased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    at least one wafer, each comprising:
        a substrate;
        an isolation structure formed in the substrate and extended from a first side of the substrate toward a second side of the substrate, wherein the second side is opposite to the first side; and
        a conductive pad formed at a dielectric layer disposed on the first side of the substrate, wherein the conductive pad is electrically connected to an active area in the substrate, wherein the conductive pad is separated from the isolation structure; and
    at least one TSV (through silicon via) structure having a circular cross-section and penetrating the at least one wafer, wherein the conductive pad contacts a sidewall of the at least one TSV structure, and electrically connects the at least one TSV structure and the active area in the substrate, wherein the isolation structure separates from and surrounds the at least one TSV structure.

2. The semiconductor device according to claim 1, wherein a number of the at least one wafer is n, and n is an integer larger than 1, wherein n wafers are stacked together, and the at least one TSV structure penetrating the n wafers, wherein each of the n wafers has the isolation structure separating from and surrounding the at least one TSV structure.

3. The semiconductor device according to claim 2, wherein each of the n wafers has a first surface on the dielectric layer which is opposite to the first side of the substrate and a second surface on the substrate which corresponds to the second side of the substrate, wherein the first surface of a first wafer in the n wafers connects to the first surface of a second wafer in the n wafers.

4. The semiconductor device according to claim 3, wherein the first wafer is disposed above the second wafer, the at least one TSV structure has a first diameter corresponding to the first wafer and has a second diameter corresponding to the second wafer, and the first diameter is greater than the second diameter.

5. The semiconductor device according to claim 2, wherein each of the n wafers has a first surface on the dielectric layer which is opposite to the first side of the substrate and a second surface on the substrate which corresponds to the second side of the substrate, wherein the first surface of a first wafer in the n wafers connects to the second surface of a second wafer in the n wafers.

6. The semiconductor device according to claim 5, wherein the first wafer is disposed above the second wafer, the at least one TSV structure has a first diameter corresponding to the first wafer and has a second diameter corresponding to the second wafer, and the first diameter is greater than the second diameter.

7. The semiconductor device according to claim 1, wherein the conductive pad is embedded in the dielectric layer.

8. The semiconductor device according to claim 1, wherein the conductive pad is exposed from the dielectric layer.

9. The semiconductor device according to claim 1, wherein a number of the at least one TSV structure is plural, and each of the TSV structures is surrounded by the isolation structure.

10. The semiconductor device according to claim 1, wherein a number of the at least one TSV structure is plural, and the TSV structures are surrounded by the isolation structure.

11. The semiconductor device according to claim 1, wherein the sidewall of the at least one TSV structure contacts a portion of the substrate and the dielectric layer.

12. The semiconductor device according to claim 1, wherein the at least one TSV structure is formed of a conductive material.

13. The semiconductor device according to claim 1, wherein the isolation structure is formed of a dielectric material.

14. The semiconductor device according to claim 1, wherein the isolation structure has a shape of circle.

15. The semiconductor device according to claim 1, wherein the isolation structure has a shape of rectangular.

* * * * *